United States Patent

Ziegler et al.

[11] Patent Number: 5,877,641
[45] Date of Patent: Mar. 2, 1999

[54] CLOCK GENERATOR AND PHASE COMPARATOR FOR USE IN SUCH A CLOCK GENERATOR

[75] Inventors: Horst Ziegler, Paderborn; Horst Diewald, Freising; Franz Prexl, Niederding; Erich Bayer, Piflas, all of Germany

[73] Assignee: Texas Instruments Incorporated, Dallas, Tex.

[21] Appl. No.: 352,487

[22] Filed: Dec. 9, 1994

[30] Foreign Application Priority Data

Dec. 10, 1993 [DE] Germany .......................... 43 42 266.7

[51] Int. Cl.$^6$ ...................................................... H03L 7/06
[52] U.S. Cl. ........................... 327/156; 327/160; 327/161
[58] Field of Search ..................... 327/156–159, 327/160, 161, 276, 277, 278, 279, 284, 291, 391, 437, 141, 142, 147–151, 153, 155; 331/17; 375/373, 375, 376

[56] References Cited

U.S. PATENT DOCUMENTS

| | | | |
|---|---|---|---|
| 4,517,532 | 5/1985 | Neidorff | 331/57 |
| 5,012,198 | 4/1991 | Okada et al. | 327/160 |
| 5,075,640 | 12/1991 | Miyazawa | 331/10 |
| 5,095,287 | 3/1992 | Irwin et al. | 331/1 A |
| 5,173,617 | 12/1992 | Alsup et al. | 327/159 |
| 5,202,906 | 4/1993 | Saito et al. | 327/156 |
| 5,218,314 | 6/1993 | Efedovich et al. | 327/284 |
| 5,331,294 | 7/1994 | Watanabe et al. | 331/57 |
| 5,355,037 | 10/1994 | Andersen et al. | 327/159 |
| 5,428,309 | 6/1995 | Uamauchi et al. | 327/156 |

FOREIGN PATENT DOCUMENTS

| | | |
|---|---|---|
| 0 265 666 A2 | 5/1988 | European Pat. Off. . |
| 0 520 558 A1 | 12/1992 | European Pat. Off. . |
| 0 528 283 A | 2/1993 | European Pat. Off. . |
| 33 13 868 A1 | 4/1983 | Germany . |
| 05 102 801 A | 4/1993 | Japan . |

*Primary Examiner*—My-Trang Nu Ton
*Attorney, Agent, or Firm*—Bret J. Petersen; Richard L. Donaldson

[57] ABSTRACT

A clock generator contains a reference oscillator (10), a digital closed delay chain (12), a digital frequency divider (14) and a digital phase comparator (16). The frequency divider (14) is connected between the output of the adjustable delay chain (12) and one input of the phase comparator (16). The output of the reference oscillator (10) is connected to a further input of the phase comparator (16). Between the output of the phase comparator (16) and the delay chain (12) a digital up-down counter (18) is connected, the counting direction of which is determined by the output signal of the phase comparator (16) and by means of which the corresponding length of the delay chain (12) is adjustable.

21 Claims, 3 Drawing Sheets

CLOCK GENERATOR AND PHASE COMPARATOR FOR USE IN SUCH A CLOCK GENERATOR

FIELD OF INVENTION

Our invention relates to a digital clock generator, and more particularly to a digital phase comparator for use in a clock generator.

BACKGROUND OF THE INVENTION

With conventional clock generators of this kind, a voltage-controlled oscillator is typically provided as an adjustable oscillator. A low-pass filter is additionally connected to the voltage-controlled oscillator from a phase comparator. In turn the output of the voltage-controlled oscillator is fed back to an input of the phase comparator to achieve a phase-locked loop (PLL).

A disadvantage in this respect is that a large number of external components is needed. In addition, the analog functional units employed—such as phase detector, low-pass filter and voltage-controlled oscillator—have a relatively complex configuration. The current consumption of such an analog clock generator is also relatively high.

An object of our invention is to create a clock generator together with a suitable phase comparator of the aforementioned kind which ensures reliable operation despite its simpler configuration and relatively low current consumption, enabling a more precise adjustment of the frequency.

SUMMARY OF THE INVENTION

This object is achieved by the adjustable oscillator being a digital delay chain, a frequency divider being a digital programmable frequency divider and by connecting a digital up-down counter between the output of the phase comparator and the delay chain, the counting direction of which is determined by an output signal of the phase comparator and by means of which the corresponding length of the delay chain is adjustable.

On the basis of this configuration it is achieved that—apart from the oscillator quartz crystal for generating the reference frequency—external components are no longer needed. Apart from the bias generator required for current control in the sections of the chain, no further functional units are provided. Accordingly, a practically all-digital integrated structure of the clock generator realized by extremely simple means. A clock generator such as this is furthermore relatively insensitive to fluctuations in the supply voltage as well as to changes in temperature and fabrication tolerances. The output clock signal can be adjusted with very high frequency accuracy. The frequency-sensing locked loop according to the invention is achieved by a system of the first order having extremely fast response.

The delay chain is preferably assigned an interpolation logic comprising a dual counter which is clocked by the output signal of the delay chain. The count of this dual counter is combined with the value of a number of least-significant bits of the output signal of the up-down counter to define, as a function of the value of these least-significant bits, the number of changes in the length of the delay chain by one step at a time for each clock cycle whilst the remaining most-significant bits directly address the delay chain.

By means of such an interpolation logic it can be assured in particular that changes in the length of the delay chain occur within the same time frame.

In one embodiment of the delay chain according to claim 3 the corresponding length of the delay chain and thus the frequency in each case can be adjusted by activating a corresponding loop inverter which defines the inversion point in each case at which the forward branch of the delay chain is directly connected with the return branch thereof.

Addressing the corresponding loop inverter is possible, for example, via the control inputs as stated in claim 4, it being good practice to undertake addressing so that only one loop inverter of the delay chain is activated at any one time.

Resetting the delay elements as defined by function, for instance on power up, is ensured in particular by the delay chain having preferably alternating delay elements of a first kind, the outputs of which are logical 0 in the reset condition, and delay elements of a second kind the outputs of which are logical 1 in the reset condition. Accordingly all connecting points of the delay chain can be reset, if required, to a precisely defined initial status, the output of the selected loop inverter assuming the correct value so that unwanted signal spikes are avoided when changes are later made to the length of the chain.

The maximum frequency step from one delay element to the next should possibly not exceed 1/6. Accordingly it is good practice to compose the delay chain of at least 6 delay elements.

On top of this the delay elements inserted with increasing chain length may have a higher delay than necessary for a shorter chain length and thus, in particular, the change in frequency as a percentage in the transfer from one delay element to the next may be maintained constant.

The inverters of the delay elements preferably contain current mirrors by means of which the driver currents in each case can be limited with no problem.

In accordance with one preferred embodiment the inverters each contain a p-type MOS field-effect transistor and an n-type MOS field-effect transistor, connected in series with a switching transistor. In this arrangement the delay of the individual delay elements can be usefully defined by the channel length of the current mirror transistors defining the driver current.

Although phase comparators of the kind as stated in the preamble of claim 15 are already known, these are, however, employed as a rule in conjunction with voltage-controlled oscillator Using these conventional phase comparators in a digital clock generator is hampered by a series of drawbacks, for instance, their up and down outputs also being regularly activated at the same time, resulting particularly in the activation of a digital up-down counter at least being rendered difficult.

By contrast the digital phase comparator according to the invention which can be employed in particular in a digital clock generator contains means to lock the non-activated output in its non-activated status as long as the other output is being reset.

As a result of this configuration, activating a digital up-down counter in particular is substantially simplified, it being for instance sufficient for this purpose to output the digital phase comparator by a simple RS flip-flop, the set and reset inputs of which are to be connected to the two outputs of the digital phase comparator. This output RS flip-flop then furnishes at one output a single activating signal which preferably serves to activate the digital up-down counter of the clock generator according to the invention, via which the delay chain serving as an adjustable oscillator is controlled.

It is basically so, however, that one such digital phase comparator according to the invention can also be employed in conjunction with a voltage-controlled oscillator.

BRIEF DESCRIPTION OF THE DRAWINGS

The invention will now be explained in more detail on the basis of the example embodiments with reference to the drawing in which.

DETAILED DESCRIPTION

Figure 1:
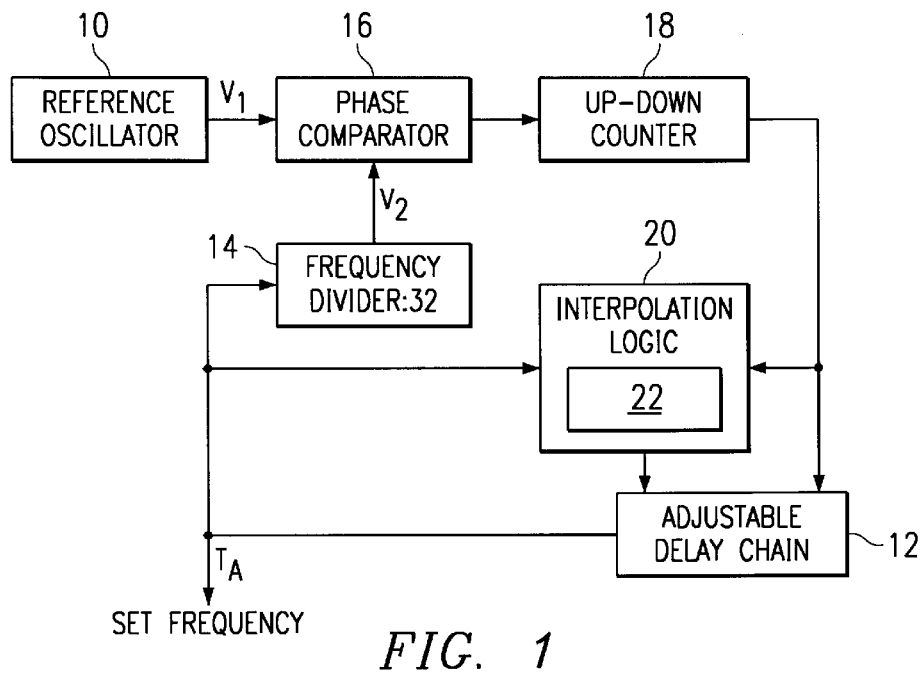
FIG. 1 is a block diagram of a digital clock generator according to the invention.

The embodiment of the digital clock generator according to the invention as shown in FIG. 1 contains a reference oscillator 10, an adjustable ring oscillator in the form of a digital closed digital chain 12, a digital programmable frequency divider 14 and a digital phase comparator 16.

The digital programmable frequency divider 14 is connected between the output of the delay chain 12 and one input ($V_2$) of the phase comparator 16. The output of the reference oscillator 10 is connected to the other input ($V_1$) of the phase comparator 16. An up-down counter 18 is connected to the output of the phase comparator 16. The output of up-down counter 18 is connected at one end to delay chain 12 and, at the other, to an interpolation logic circuit 20. Delay chain 12 can be activated by interpolation logic circuit 20 just the same as via the output of the up-down counter 18 as indicated by the arrows entered in the figure.

Interpolation logic circuit 20 contains a dual counter 22 which is clocked by the output signal of delay chain 12. The count of dual counter 22 is combined with the value of a number of least-significant bits of the output signal of up-down counter 18 so that the number of changes in the length of the chain is defined by one step each for one corresponding clock cycle as a function of the value of the least-significant bits. The remaining most significant bits of up-down counter 18 serve to address the delay chain directly by means described in more detail below.

The output clock signal $T_A$ from delay chain 12 is fed back via digital frequency divider 14 to input $V_2$ of phase comparator 16. Apart from being provided to interpolation logic 20, output clock signal $T_A$ is also preferably used to clock updown counter 18.

In the embodiment illustrated, reference oscillator 10 contains a 32 kHz oscillator quartz crystal. Output clock signal $T_A$ is divided down by 32 to 1 kHz by frequency divider 14. Delay chain 12 is composed of 32 weighted delay elements 24, 26 connected in series (see FIGS. 2 thru 5).

Up-down counter 18 is a 10-bit counter while a dual counter 22 used in the interpolation logic 20 is a 5-bit counter. The five least-significant bits of the output signal of up-down counter 18 are combined accordingly with the count of the dual counter 22, whereas the five most-significant bits of the output signal of up-down counter 18 are used to directly address delay chain 12.

In the phase comparator 16 of the first-order system illustrated the output signal $V_1$ from reference oscillator 10 is compared to the output signal $V_2$ from programmable frequency divider 14, preset to the divisor 32. In accordance with the comparison phase comparator 16 furnishes an output signal which determines the counting direction of up-down counter 18. The count of up-down counter 18 and a control variable additionally furnished by interpolation logic 20 are used to adjust the length of delay chain 12 to zero the frequency deviation detected by phase comparator 16. When frequency divider 14 is preset to divisor 32, output clock signal $T_A$ is adjusted to a frequency of 1 MHz (1024 kHz).

Figure 2:
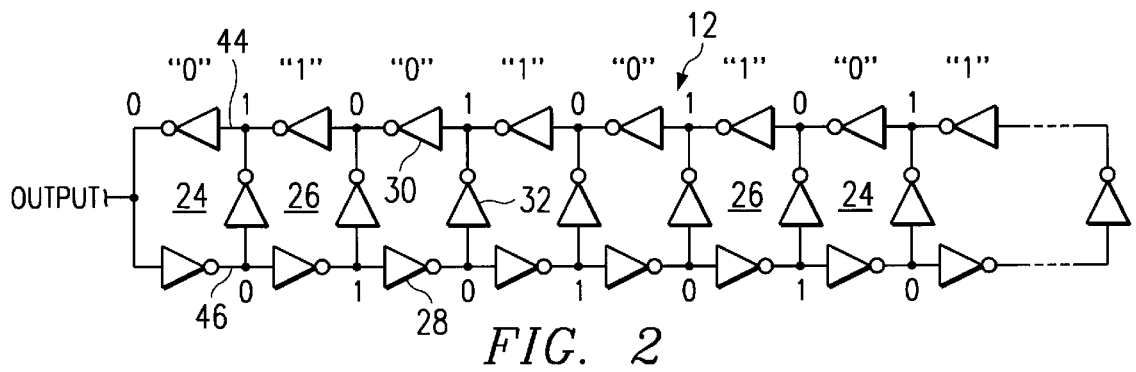
FIG. 2 is a schematic representation of the digital delay chain of the clock generator in its reset status.
Figure 3:
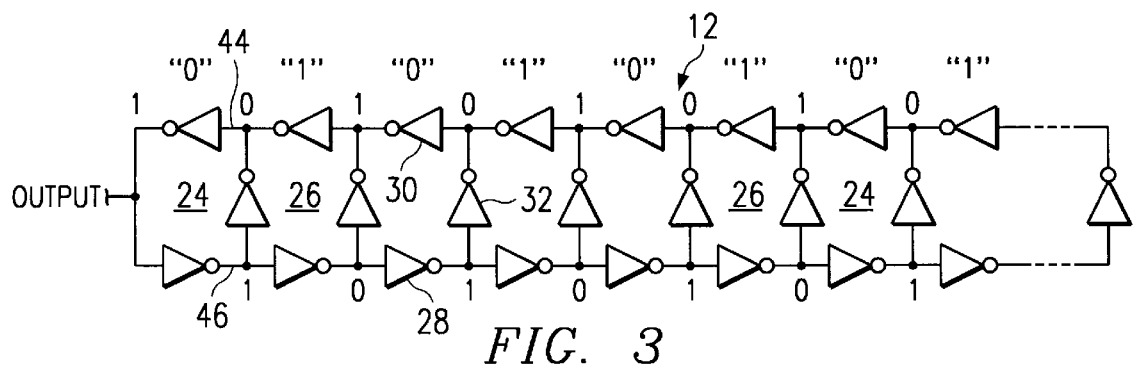
FIG. 3 illustrates the delay chain shown in FIG. 2 directly following a change in status at its output.

FIGS. 2 and 3 are simple schematics of digital closed delay chain 12 alternately having delay elements 24 of a first kind (the outputs of which when reset are 0) and delay elements 26 of a second kind (the outputs of which when reset are 1). In FIGS. 2 and 3, the corresponding outputs of delay elements 24, 26 at reset are indicated in quotes.

FIG. 2 shows delay elements 24, 26 directly after resetting. The output at the end of the return path 44 has just changed to 0. While this new value is being applied to the input of forward path 46, it has yet to change the output of the first inverter of forward path 46. Along the forward path 46, the inverters thus have the output values 0, 1, 0. 1, . . . in the forward direction.

Corresponding values exist at the outputs of the inverters in return path 44 when read in the direction opposite to signal flow. In other words, every delay element 24, 26 has an output in both the forward and reverse directions. The two outputs of the first delay element 24 (at left in FIG. 2) are 0, the outputs of second delay element 26 are 1, the outputs of third delay element 24 are again 0, and so on.

Following each pair of inverters 28, 30 of forward path 46 and return path 44 is an inverter 22 in the form of a ladder rung connected between forward path 46 and return path 44. This transverse inverter 32 enables the length of delay chain 12 to be shortened or lengthened as described in more detail below. Only one inverter 32 at a time is activated, and the remainder of the delay chain 12 to the right is no longer active.

FIG. 3 shows the status of the delay chain 12 immediately after the output of the delay chain 12 has changed its values from 0 to 1 and after the complete chain as shown in FIG. 3 has been activated. Accordingly the outputs of the inverters in the forward path 46 and the return path 44 alternatively have the values 1, 0, 1, 0 and so on. In the illustration shown in FIG. 3 the value 1 at the output is still to affect the input of the first inverter of the forward path 46 and thus its output is still 1. By activating an inverter 32, the delay chain can be shortened, increasing the frequency of ring oscillator 12

Figure 4:
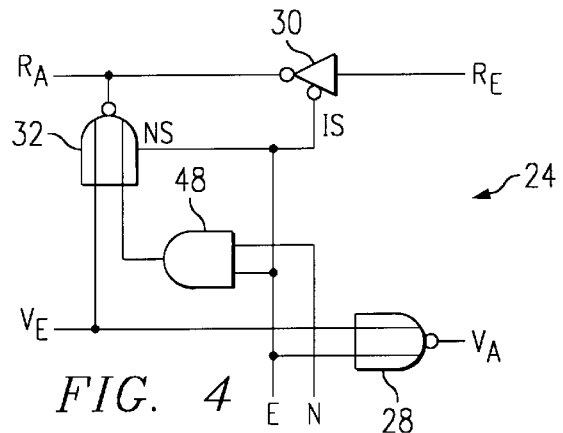
FIG. 4 is the circuit diagram of a delay chain element of the first kind.

In FIG. 4 a circuit diagram of a delay element 24 of the first kind is shown, in which the reset condition has 0 at its two outputs $V_A$ and $R_A$.

Figure 5:
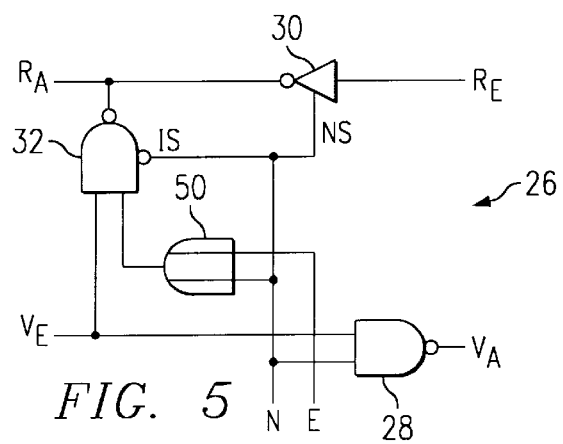
FIG. 5 is the circuit diagram of a delay chain element of the second kind.

By contrast, FIG. 5 shows a delay element 26 of the second kind, in which the reset condition has 1 at its two outputs $V_A$ and $R_A$.

Each delay element 24, 26 in delay chain 12 has a forward inverter 28 and a return inverter 30, as well as a loop inverter 32 which when activated adjusts the corresponding length of the chain. The delay elements 24, 26 further contain two control inputs E, N via each of which their forward inverter 28 and return inverter 30 or their loop inverter 32 can be activated or the corresponding delay element 24, 26 reset. Addressing the delay chain 12 via control inputs E, N is performed such that only one loop inverter 32 at a time is activated. Resetting the delay elements 24, 26 is best done automatically on every power up.

In delay element 24 of FIG. 4, the forward inverter contains a NOR gate 28 having a forward output $V_A$. Return inverter 30 with return output $R_A$ has an inverted control input IS by which it can be activated by applying a 0 control signal. Loop inverter 32 has a NOR gate 32, the output of which is connected to the output $R_A$ of return inverter 30. NOR gate 32 has a non-inverted control input NS by which it can be activated by applying a 0 control signal. The forward input $V_E$ of the delay element 24 is connected to one input of NOR gate 32 and to one input of NOR gate 28. The other input of NOR gate 32 is connected to the output of an AND gate 48, the two inputs of which are respectively connected to control inputs E and N. Control input E is also connected to the other input of NOR gate 28, and to both inverting control input IS of return inverter 30 and non-inverting control input NS of NOR gate 32.

The function of delay element 24 is evident from the following truth table 1:

TABLE 1

| INPUT | | OUTPUT | |
|---|---|---|---|
| E | N | $V_A$ | $R_A$ |
| 0 | 1 | $\overline{V}_E$ | $\overline{R}_E$ |
| 1 | 0 | 0 | $V_E$ |
| 1 | 1 | 0 | 0 |

The table indicates that the two outputs $V_A$ and $R_A$ of delay element 24 are reset to 0 when both control inputs E, N become 1.

On the other hand, when control input E is 0 and control input N is 1, forward inverter 28 and return inverter 30 are activated while loop inverter 32 is deactivated. Accordingly, the inverted value $\overline{V}_E$ of the forward input $V_E$ appears at the forward output $V_A$ while $\overline{R}_E$ of the return input $R_E$ appears at the return output $R_A$.

Loop inverter 32 is activated or addressed when control input E is 1 and control input N is 0. In this case, forward output $V_A$ is 0 while return output $R_A$ equals the inverted value $\overline{V}_E$ of forward input $V_E$. In this case, this loop inverter 32 determines the length of delay chain 12. The remaining loop inverters remain deactivated.

In the delay element 26 of FIG. 5 the forward input 28 contains a NAND gate 28 and the loop inverter a NAND gate 32. An inverting control input IS of the NAND gate 28 is connected together with a non-inverting control input NS of the return input 30 to the control input N of the delay element 26. This control input N is further connected to an input of the NAND gate 28 and to an input of an OR gate 50 which has a further input connected to the control input E of the delay element 26. The output of the OR gate 50 is connected to an input of the NAND gate 32 which has a further input to which the forward input $V_E$ of the delay element 26 is connected. At this forward input $V_E$ of the delay element 26 a further input of the NAND gate 28 is connected. The forward output $V_A$ is formed by the output of this NAND gate 28. The output of the return input 30 and the output of the NAND gate 32 are connected to the reference oscillator $R_A$ of the delay element 26 whilst the return input $R_E$ of the delay element 26 is formed by the input of the return input 30.

The function of this delay element 26 of the second kind is evident from the following truth table 2:

TABLE 2

| INPUT | | OUTPUT | |
|---|---|---|---|
| E | N | $V_A$ | $R_A$ |
| 0 | 1 | $\overline{V}_E$ | $\overline{R}_E$ |
| 1 | 0 | 1 | $V_E$ |
| 0 | 0 | 1 | 1 | indicating that each of the two outputs $V_A$ and $R_A$ of the delay element 26 are reset to the value 1 when both control inputs E, N have the value 0.

When the control input E is set to the value 0 and the control input N to the value 1, then the forward inverter 28 and the return inverter 30 are activated whilst the loop inverter 32 remains deactivated. In this case the inverted value $\overline{V}_E$ of the forward input $V_E$ results at the forward output $V_A$ and the inverted value $\overline{R}_E$ of the return input $R_E$ at the reference oscillator $R_E$.

If, however, the control input E assumes the value 1 and the control input N the value 0, the loop inverter 32 is activated, resulting in the inverted value $\overline{V}_E$ of the forward input $V_E$ occurring at the return input $R_A$ whilst the forward output $V_A$ is held at the value 1.

As evident from FIGS. 2 and 3 the delay chain 12 has a delay element 24 of the first kind at the left end furnishing the output clock signal $T_A$.

Achieving the transistor circuitry of this delay chain 12 deviates somewhat from the usual CMOS structure. All inverters 28, 30; 32 contain current mirror circuits to limit the driver current in each case. A bias voltage generator furnishes the voltage for gating a p-type MOS FET and an n-type MOS FET connected in series with the switching transistors. Accordingly, the output current of each delay element 24, 26 can easily be determined by the channel length ratios. The width of all transistors and the length of the switching transistors can be reduced to a minimum. To reduce the switching noise between the stages and to avoid charge takeover effects the current mirror transistors can be directly connected to the output.

The current consumption within the delay chain 12 is mainly determined by the capacitances between the delay elements 24, 26 needing to be recharged.

The setpoint frequency of 1 MHz should be attained under normal conditions (3 V, 27° C. typical fabrication parameters) by roughly half of the delay chain 12 being activated, this leaving enough space to both ends for deviations from the nominal values. A capacitance of 2×70 fF is achieved for each delay element, for instance, as long as the circuit has been designed for a minimum capacitance. The current needed to recharge 32 capacitances of 16 delay elements 24, 26 is given by the following:

$$I = \frac{32 \times 70 fF \times 1.5 \text{ V}}{0.5 \mu s} \approx 7 \mu A$$

The maximum step in frequency from one delay element 24, 26 to the next should not exceed 1/6. Accordingly the delay chain 12 should preferably contain at least six delay elements 24, 26.

The delay of the various delay elements 24, 26 can be increased with increasing length of the chain without the step in frequency being greater than 1/6. For example, the 13th delay element can have twice the delay than that of the first delay element.

The delay of the various delay elements can simply be increased by correspondingly increasing the channel length of the transistors defining the current in the current mirror concerned. In this way the perceptual change in the frequency from one delay element to the next can be maintained more or less constant, whereby the usual deviations in the fabrication parameters are tolerable.

The first 9 delay elements 24, 26 can furnish a driver current of approx. 10 $\mu$A, the maximum output then being continually reduced. For setpoint frequencies other than 1 MHz the recharging current can be simply changed, for example, by changing the resistor determining the current in the bias voltage generator.

A conventional CMOS inverter may be employed at least as a loop inverted.

Every change in the addressing of the delay chain 12 or the length thereof requires a corresponding change in the values of both control inputs E, N. Since it cannot be assured in general that both control signals change at the same time and thus a reset condition can materialize for a brief instant, the change in the address should be effective at the moment the status as shown in FIG. 2 occurs so that no signal spikes are produced whatsoever even if there is a fleeting occurrence of the reset mode.

The frequency divider 14, the interpolation logic circuit 20 and the up-down counter are clocked with the output of the delay chain 12. This clock pulse, having a frequency of 1 MHz for instance, is divided, by the frequency divider 14 by, for example,32 and compared to the 32 kHz reference frequency in the phase comparator 16. The frequency divider 14 is programmable, for example, between 1 and 127.

The output signal of the phase comparator 16 then dictates the counting direction of the 10 bit up-down counter 18, the five most-significant bits of which directly address the delay chain 12.

It must be assured that the return edge of the clock pulse in the chain does not attain the loop or turning point before the change in the address. The maximum adjustable frequency is normally limited by the delays of the frequency divider 14, the phase comparator 16, the interpolation logic circuit 20 and the 10 bit up-down counter 18. This loop (turning) point is attained after ¼ of the clock cycle.

If the delay is excessive, this could easily give rise to a noisy signal spike. This problem can be remedied right from the start by locking the address directly following the rising edge of the clock pulse. Sufficient time is then available (half a clock cycle) to establish the new address, since the locking circuit at the input of the delay chain does not again become transparent until the falling edge of the clock pulse occurs. A fleeting occurrence of the reset mode at this point in time can no longer cause a signal spike as is clearly evident from FIG. 2.

In case a reset mode occurs the outputs of a corresponding delay chain 24 of the first kind are set to 0, whilst the outputs of a corresponding delay chain 26 of the second kind are set to 1.

Since for a frequency divider 14 preset e.g. to 32 the counting direction of the 10 bit up-down counter 18 can be changed at best not before 32 clock pulses, when new information is present at the output of the phase comparator 16, it is likely that in the frequency-locked condition the up-down counter 18 will count in the wrong direction for various clock cycles. Expressed otherwise, the frequency can swing about the locked value. Even after 32 clock cycles the counting direction cannot be instantly sensed. Since the actual frequency and the setpoint frequency are not far apart, several 32 kHz clock cycles may be necessary to establish the deviation in frequency.

To improve the response of the clock generator the five most-significant bits of the up-down counter 18 are used to address the delay chain 12, whilst the remaining five least-significant bits are combined with the outputs of the 5-bit dual counter 22 of the interpolation logic circuit 20. The higher the value of the five least-significant bits, the more often is the delay chain 12 shortened by one step for a clock cycle. Using this 5-bit dual counter 22 ensures that shortening of the chain occurs in the same time frame.

The following Table 3 indicates when the delay chain 12 is shortened by one step each time, whereby the output value of the 5-bit dual counter 22 is given in the horizontal direction and the value of the five least-significant bits of the 10 bit up-down counter is given in the vertical direction.

TABLE 3

| | | | | | | | | 5 BIT COUNTER 22 | | | | | | | | | |
|---|---|---|---|---|---|---|---|---|---|---|---|---|---|---|---|---|---|
| | 0 | 1/17 | 2/18 | 3/19 | 4/20 | 5/21 | 6/22 | 7/23 | 8/24 | 9/25 | 10/26 | 11/27 | 12/28 | 13/29 | 14/30 | 15/31 | 16 |
| UP-DOWN COUNTER (5 Lowest bits) | | | | | | | | | | | | | | | | | |
| 0 | | | | | | | | | | | | | | | | | |
| 1 | | | | | | | | | | | | | | | | | X |
| 2 | | | | | | | | | X | | | | | | | | |
| 3 | | | | | | | | | X | | | | | | | | X |
| 4 | | | | | X | | | | | | | | X | | | | |
| 5 | | | | | X | | | | | | | | X | | | | X |
| 6 | | | | | X | | | X | | | | | X | | | | |
| 7 | | | | | X | | | X | | | | | X | | | | X |
| 8 | | X | | | | X | | | | X | | | | X | | | |
| 9 | | X | | | | X | | | | X | | | | X | | | X |
| 10 | | X | | | | X | | X | | X | | | | X | | | |
| 11 | | X | | | | X | | X | | X | | | | X | | | X |
| 12 | | X | X | | | X | | | | X | | X | | X | | | |
| 13 | | X | X | | | X | | | | X | | X | | X | | | X |
| 14 | | X | X | | | X | | X | | X | | X | | X | | | |
| 15 | | X | X | | | X | | X | | X | | X | | X | | | X |
| 16 | X | | X | | X | | X | | X | | X | | X | | X | | |

TABLE 3-continued

5 BIT COUNTER 22

|    | 0 | 1/17 | 2/18 | 3/19 | 4/20 | 5/21 | 6/22 | 7/23 | 8/24 | 9/25 | 10/26 | 11/27 | 12/28 | 13/29 | 14/30 | 15/31 | 16 |
|----|---|------|------|------|------|------|------|------|------|------|-------|-------|-------|-------|-------|-------|----|
| 17 |   | X    |      | X    |      | X    |      | X    | X    |      | X     |       | X     |       |       | X     | X  |
| 18 |   | X    |      | X    |      | X    |      | X    | X    | X    |       | X     |       | X     |       | X     |    |
| 19 |   | X    |      | X    |      | X    | X    | X    |      |      | X     |       | X     |       |       | X     | X  |
| 20 |   | X    | X    | X    |      | X    |      | X    |      |      | X     | X     | X     |       |       | X     |    |
| 21 |   | X    | X    | X    |      | X    |      | X    |      |      | X     | X     | X     |       |       | X     | X  |
| 22 |   | X    | X    | X    |      |      | X    | X    | X    |      | X     | X     | X     |       |       | X     |    |
| 23 |   | X    | X    | X    |      | X    | X    | X    |      |      | X     | X     | X     |       |       | X     | X  |
| 24 | X | X    | X    |      | X    | X    | X    |      | X    | X    | X     |       | X     | X     | X     |       |    |
| 25 | X | X    | X    |      | X    | X    | X    |      | X    | X    | X     |       | X     | X     | X     |       | X  |
| 26 | X | X    | X    |      | X    | X    | X    | X    | X    | X    | X     |       | X     | X     | X     |       |    |
| 27 | X | X    | X    |      | X    | X    | X    | X    | X    | X    | X     |       | X     | X     | X     |       | X  |
| 28 | X | X    | X    | X    | X    | X    | X    |      | X    | X    | X     | X     | X     | X     | X     |       |    |
| 29 | X | X    | X    | X    | X    | X    | X    |      | X    | X    | X     | X     | X     | X     | X     |       | X  |
| 30 | X | X    | X    | X    | X    | X    | X    | X    | X    | X    | X     | X     | X     | X     | X     |       |    |
| 31 | X | X    | X    | X    | X    | X    | X    | X    | X    | X    | X     | X     | X     | X     | X     |       | X  |

After this the step change frequency with the value of the five least-significant bits of the up-down counter 18 increases.

This interpolation logic 20 supports elevating the control frequency in the locked status so that the frequency deviation as a whole is reduced within brief periods of time.

The phase generator 16 of the clock generator shown in FIG. 1 serves to define the counting direction of the up-down counter 18 in the all-digital loop. This up-down counter furnishes a corresponding output signal, by means of which the length of the closed delay chain 12 and thus the setpoint frequency is controlled.

The digital phase comparator used for this purpose may have, for example, an up output and a down output to establish the counting direction of the up-down counter 18 according to the status of the two input signals $V_1$, $V_2$ (viz. FIG. 1). In this respect the digital phase comparator can be suitably designed so that, depending on which of the two input signals first assumes its active value, the assigned up output and down output respectively is set to an active value and reset following the other input signal becoming active. Phase comparators of this kind are already employed in PLL circuits in which the duty cycle of both outputs is employed as a measure of the deviation in phase and frequency.

Such a phase comparator cannot, however, be employed directly in the digital clock generator shown in FIG. 1, especially since to activate the up-down counter 18 a discrete control signal is to be preferably provided, by means of which the corresponding counting direction is determined. One simple solution of creating such a discrete control signal could be to connect the up and down outputs of the digital phase comparator to the set and reset inputs of a discrete RS flip-flop and to pick off the control signal at one output of this flip-flop. However, this solution may result in noisy voltage spikes when using known digital phase comparators as is evident from FIGS. 6 and 7.

Figure 6:
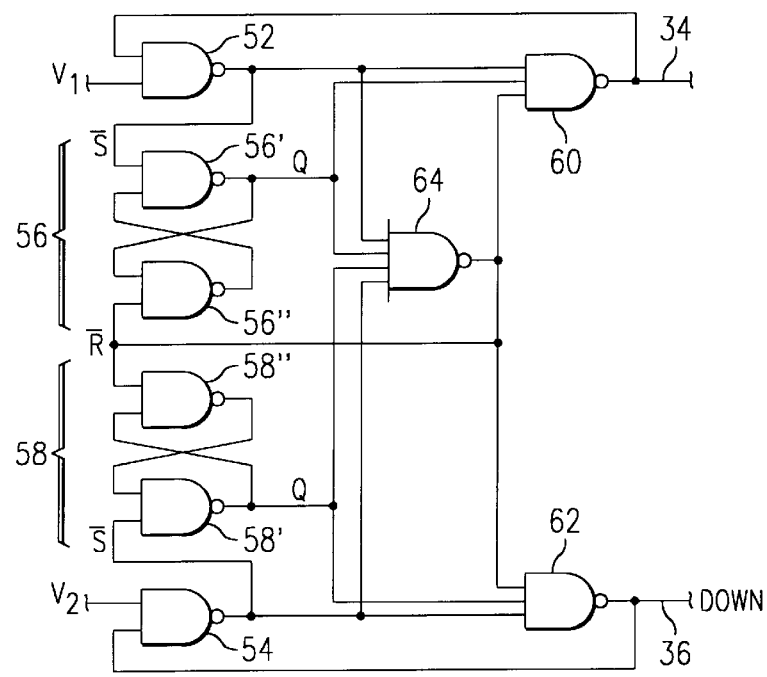
FIG. 6 is the circuit diagram of a known digital phase comparator.

In FIG. 6 a known digital phase comparator is shown having two inputs for the input signals $V_1$ and $V_2$ and an up output 34 and a down output 36.

The inputs $V_1$ and $V_2$ of this known digital phase comparator simultaneously form the inputs of two input gates, i.e. NAND gate 52 and NAND gate 54 respectively. On the one hand the output of the NAND gate 52 is connected to the set input S of an RS flip-flop 56 comprising two NAND gates 56', 56" and, on the other, to an input of an output gate, namely the NAND gate 60. The output of the NAND gate 60 is fed back to a further input of the NAND gate 52. The output of the NAND gate 60 forms simultaneously the up output 34 of the digital phase comparator.

Correspondingly, the output of the NAND gate 54 is connected on the one hand to the set input S of an RS flip-flop 58 comprising two NAND gates 58', 58" and, on the other, to an input of an output gate, namely the NAND gate 62. In turn, the output of the NAND gate 62 is fed back to a further input of the NAND gate 54, the output of the NAND gate 62 forms simultaneously the down output 36 of the digital phase comparator.

The output Q of the RS flip-flop 56 is connected on the one hand to a further input of the NAND gate 60 and, on the other, to an input of a further NAND gate 64. The output Q of the other RS flip-flop 58 is connected on the one hand to a further input of the NAND gate 62 and, on the other, to a further input of NAND gate 64. This NAND gate 64 has two further inputs which are connected to the output of the NAND gate 52 and the output of the NAND gate 54 respectively. The output of the NAND gate 64 is connected to a third input of the NAND gate 60 as well as to a third input of the NAND gate 62 and, in addition to this, is also connected to the reset input $\overline{R}$ of the RS flip-flop 56 as well as to the corresponding reset input $\overline{R}$ of the RS flip-flop 58.

In this known digital phase comparator, the NAND gate 64 accordingly serves to reset the up and down outputs 34, 36 of the phase comparator to 1 and the two RS flip-flops 56, 58 to 0.

Figure 7:
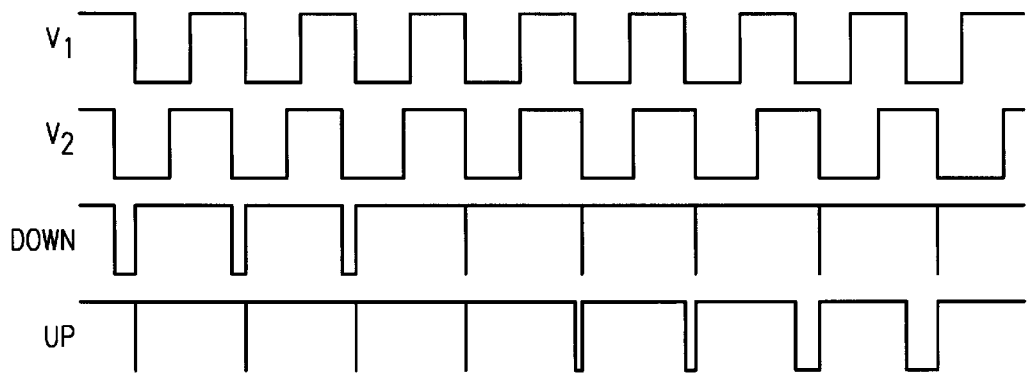
FIG. 7 illustrates the time profile of the signal at the inputs and outputs of the known phase comparator shown in FIG. 7.

Otherwise the functioning of this known phase comparator is evident from the time signal profiles as shown in FIG. 7 to which reference is made in the following.

When—for $V_1=0$ and $V_2=0$—the two RS flip-flops 56, 58 are reset to the value 0, then the two up and down outputs 34, 36 of the digital phase comparator are each reset to 1. If then the input signal $V_1=1$ the RS flip-flop 56 is set to the value 1. The up and down outputs 34, 36 of the phase comparator continue to have the value 1.

Should then the other input signal $V_2$ assume the value 1, then the other RS flip-flop 58 will additionally be set to 1. The up and down outputs 34, 36 of the digital phase comparator continue to have the value 1. By the next falling edge of the of the input signal $V_1$ or of the input signal $V_2$ the corresponding output 34 and 36 respectively of the phase comparator is set to the active value 0.

When we now assume, for example, that input signal $V_1$ is the first to reassume the value 0, then the up output 34 of the phase comparator will be accordingly set to active 0. The down output 36 retains its value 1.

When subsequently the input signal $V_2$ also reassumes the value 0 the up output 34 is reset, as wanted, to the value 1, but at the same time an unwanted 0 pulse (viz. FIG. 7) materializes at the down output 36 which can result in pulse signal noise when the up counter 18 (FIG. 1) is activated. In particular it is directly not possible to generate a single activation signal for the up-down counter 18 by providing one further RS flip-flop at the output. In this case too, there is no assurance of the circuit being free of noise.

If, instead however, the input signal $V_2$ assumes the value 0, then the down output 36 will first be set to the value 0. If then the input signal $V_1$ also reassumes the value 0, the down output 36 previously set to 0 will be reset to 1. In this case, however, a noisy 0 pulse results at the up output 34 (viz. FIG. 7).

Figure 8:
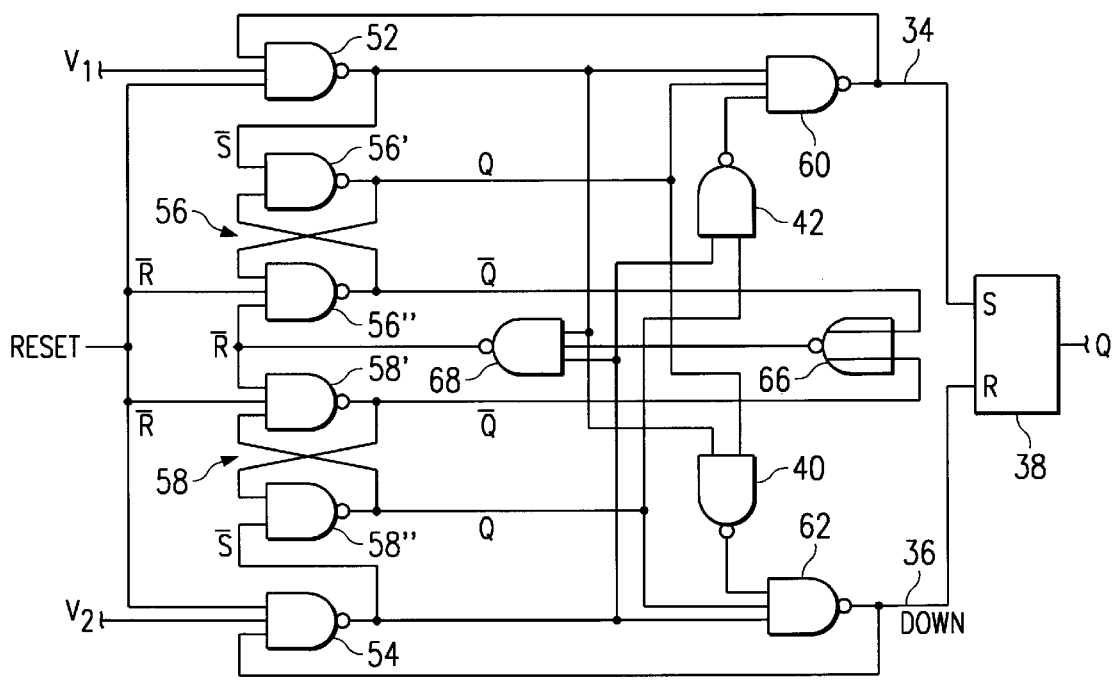
FIG. 8 is the circuit diagram of a digital phase comparator according to the invention.

Now in turning to FIG. 8 an embodiment of the digital phase comparator according to the invention will be evident which can be used to advantage particularly in the clock generator according to the invention as shown in FIG. 1.

This digital phase comparator according to the invention comprises in turn two input gates, namely NAND gate 52 and NAND gate 54. The input signal $V_1$ is applied to one input of the NAND gate 52 whilst the other input signal $V_2$ is available at one input of the NAND gate 54.

The output of the NAND gate 52 is connected on the one hand to the set input ~S of an RS flip-flop 56 comprising two NAND gates 56 , 56" and, on the other, to one input of an output gate, namely NAND gate 60. The output Q of the RS flip-flop 56 is connected to a further input of the NAND gate 60. The output of the NAND gate 60 connected to the up output 34 of the digital phase comparator is fed back to a further input of the NAND gate 52.

The output of the NAND gate 54 is connected on the one hand to the set input ~S of an RS flip-flop 58 and, on the other, to one input of an output gate, namely NAND gate 62. The output Q of the RS flip-flop 58 is connected to a further input of the NAND gate 62. The output of the NAND gate 62 forming the down output 36 of the digital phase comparator is fed back to a further input of the NAND gate 54.

To this extent this digital phase comparator is identical to the one shown in FIG. 6 and thus like reference numerals are used for like gates.

In the phase comparator according to the invention as shown in FIG. 8, however, the function of the NAND gate 64 provided in the known phase comparator (viz. FIG. 6) is shared by three NAND gates 40, 42, 68 and a NOR gate 66. In addition a further reset input RESET is provided to return the circuit to a defined status, preferably on power up. An embodiment of one such configuration of the digital phase comparator according to the invention will now be evident from the following description, again with reference to FIG. 8.

With reference thereto output Q of the RS flip-flop 56 is additionally connected to an input of a NAND gate 40, the output of which is connected to a further input of the NAND gate 62.

Accordingly output Q of the RS flip-flop 58 is additionally connected to an output of a NAND gate 42. the output of which is connected to a further input of the NAND gate 60.

One further input of the NAND gate 40 is connected to the output of the NAND gate 52 whilst a further input of the NAND gate 42 is connected to the output of the NAND gate 54.

The output $\overline{Q}$ of the RS flip-flop 56 is connected to an input of a NOR gate 66 having a further input to which the corresponding output $\overline{Q}$ of the RS flip-flop 58 is connected. The output of the NOR gate 66 is connected to one input of a further NAND gate 68 having two further inputs which are connected to the output of the NAND gate 52 and the output of the NAND gate 54 respectively. The output of the NAND gate 68 is simultaneously connected to both one reset input $\overline{R}$ of the RS flip-flop 56 and one reset input $\overline{R}$ of the RS flip-flop 58.

On top of this, the digital phase comparator according to the invention is provided with an additional reset input RESET which is connected to a further reset input $\overline{R}$ of the RS flip-flop 56, a further reset input $\overline{R}$ of the RS flip-flop 58, a further input of the NAND gate 52 as well as to a further input of the NAND gate 54.

Figure 9:
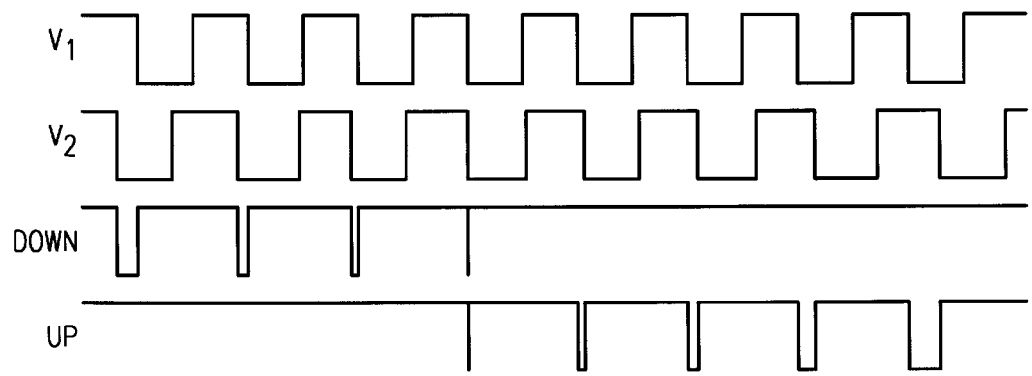
FIG. 9 illustrates the time profile of the signal at the inputs and outputs of the known phase comparator shown in FIG. 8.

The way in which the digital phase comparator according to the invention functions will now be evident from considering the time signal profiles shown in FIG. 9 illustrating the two input signals $V_1$, $V_2$ as well as the output signals at the down and up outputs 34, 36 as a function of time.

When both input signals $V_1$, $V_2$ are each 0 and both RS flip-flops 56, 58 are reset to 0 (output Q), the up and down outputs 34, 36 of the digital phase comparator according to the invention are reset to 1. In this defined output status the phase comparator can be set in particular by a 0 pulse at the additional reset input RESET.

When the input signal $V_1$ additionally assumes the value 1, the assigned RS flip-flop 56 is set to the value 1 (output Q).

When the input signal $V_2$ then assumes the value 1, the further RS flip-flop 58 will also be set to the value 1 (output Q) whereby the output of the NOR gate 66 changes in value from 0 to 1 since both the output $\overline{Q}$ of the RS flip-flop 56 as well as the output $\overline{Q}$ of the RS flip-flop 58 each assume the value 0.

If the input signal $V_1$ is then the first to change its value from 1 to 0 again, then active 0 is set accordingly at the up output 34. Here, the important thing is that due to the change in the input signal $V_1$ the output of the NAND gate 40 is also set to the value 0.

When the other input signal $V_2$ also reassumes the value 0, RS flip-flop 58 is first reset to the value 0 (output Q). With value 1 at the output of the NAND gate 54 the value 0 will also occur at first at the output of the NAND gate 68, this also causing the other RS flip-flop 56 to be reset to the value 0 (output Q). Accordingly the up output 34 of the digital phase comparator is reset to the value 1. Since the NAND gate 40 first maintains the value 0 at its output, until also the RS flip-flop 56 has been reset to 0 (output Q) and, before then, the output Q of the RS flip-flop 58 has already been set to the value 0, the down output 36 of the digital phase comparator is maintained (locked) to its existing value 1 at the same time as the up output 34 is reset to the value 1. When the output of the NAND gate 40 again assumes the value 1 after RS flip-flop 56 has been reset, then as soon as the output Q of the RS flip-flop 58 assumes the value 0 it is already assured that the NAND gate 62 continues to retain the value 1 at the down output 36.

As soon as the RS flip-flop 58 has been reset, the value 0 materializes at the output of the NOR gate 66, this in turn causing the output of the NAND gate 68 to be reset to the value 1 so that the reset pulse at the output of this NAND gate 68 or at the reset inputs $\overline{R}$ of the two RS flip-flops 56,58 is terminated.

If, instead, the input signal $V_2$ is the first to assume the value 0, then the down output 36 of the digital phase comparator is first set to 0. Should then the input signal $V_1$ change to the value 0, then the down output 36 too will be reset to 0 without any negative pulse materializing at the up output 34. In this case the NAND gate 42 ensures that the value 1 is maintained or locked at the up output 34.

The fact that a pulse occurs at both the up output 34 and the down output 36 when the two input signals $V_1$ and $V_2$ are negative-going in coincidence is uncritical, since in this case there is no correct or incorrect counting direction.

As a result of this configuration it is thus assured an active 0 signal exists at only one of the two outputs 34, 36 at any one time. Now, however, a simple RS flip-flop 38 can be used in particular for generating a single activation signal for the up-down counter 18 (viz. FIG. 1) as is evident from FIG. 8. In this arrangement it is useful to connect the up output 34 to the set input S and the down output 36 to the reset input R of the RS flip-flop 38. An output Q of this RS flip-flop 38 then dictates the counting direction of the up-down counter 18 of the digital clock generator shown in FIG. 1.

The digital phase comparator according to the invention may be put to use, however, not only in all-digital loops such as in particular in the clock generator as shown in FIG. 1 but also, for example, in combination with an oscillator, e.g. in an analog loop.

In addition to this, instead of active 0 signals it is also possible to basically to use active 1 signals, for the purpose of which a correspondingly complementary circuit configuration is to be selected. Finally, instead of the RS flip-flop 38, any other suitable terminating circuit for generating the single activation signal for the digital up-down counter may be provided.

It is useful to reset the length of the delay chain 16 to its maximum value on power up, the phase comparator then preferably setting its up output to the active value until the frequency produced at the output of the frequency divider is more or less the same as the reference frequency.

Any shift in phase at the set frequency may be counteracted, for example, by reducing the extent of the switching stages in the delay chain and/or by synchronizing the output signal of the frequency divider with the reference frequency as soon as the phase shift exceeds a critical value, thus enabling the amplitude of any oscillation about the set value (jitter) to be significantly reduced. Since fleeting deviations in frequency are also reduced to a minimum, exceptionally precise adjustment of frequency is possible so that even protocols of an asynchronous data exchange can be made use of.

Since the circuit permits programming, simple handling is assured. The control action can be simply defeated and discrete frequencies can be programmed as desired. Deactivating the closed control loop and selecting lower frequencies results in the current consumption of the complete system being further reduced.

Normally closed loop control commences on power up of the full chain length, i.e. at the lowest possible frequency.

The time need to set the delay chain can be further reduced, for example, by counting the clock pulses generated within one cycle of the reference frequency for the complete chain and calculating the setpoint length, thus enabling the chain to be preset to this calculated length so that the total time needed for adjustment after power up is reduced.

We claim:

1. A clock generator comprising:
   a reference oscillator for generating a reference clock signal;
   a digital phase comparator having a reference input for receiving the reference clock signal, a feedback input for receiving a feedback signal and an adjusting output for generating a comparator signal indicating a counter direction;
   a digital up-down counter responsive in direction to the comparator signal for generating a delay line length control signal;
   an adjustable oscillator, comprising a digital closed delay chain whose length is determined by the delay line length control signal, for generating an output oscillator signal responsive to the comparator signal;
   a frequency divider, comprising a digital programmable frequency divider, responsive to the adjustable oscillator for dividing the output oscillator signal to generate the feedback signal for the phase comparator's feedback input; and
   an interpolation logic circuit containing a counter which is clocked by the output signal of said delay chain, the count of this counter being combined with the value of a number of least significant bits of the output signal of said up-down counter to determine from the combination whether to change the length of said delay chain by one step, while a remaining most-significant bits of said up-down counter directly address said delay chain.

2. The clock generator of claim 1 wherein the delay chain is composed of a plurality of delay elements connected in series, each containing a forward inverter, a return inverter as well as a loop inverter operative to adjust the length of said delay chain.

3. A clock generator as set forth in claim 2, characterized in that said delay elements (24, 26) have control inputs (E, N) via which their forward inverters (28) and their return inverters (30) or their loop inverters (32) can be activated or the corresponding delay element (24, 26) can be reset.

4. A clock generator as set forth in claim 3, characterized in that the addressing of said delay chain (12) via said control inputs (E, N) is such that only one loop inverter (32) at a time is activated.

5. A clock generator as set forth in claim 2 characterized in that said delay chain has a plurality of alternating delay elements of a first type, the outputs of which are logical 0 in the reset condition, and a plurality delay elements of a second type, the outputs of which are logical 1 in the reset condition.

6. A clock generator as set forth in claim 5, wherein said first type delay elements are further characterized by:
   the forward inverter comprising a NOR gate having a forward input and a forward output;
   the return inverter having a return output and an inverted control input;
   the loop inverter comprising a NOR gate with the output connected to the return output of the return inverter and a first input connected to the forward input signal of the forward inverter; and
   an AND gate with two inputs connected to two control inputs E and N and an output connected to a second input of the loop inverter NOR gate;
   and wherein the control input E is also connected to the forward inverter NOR gate control input and an enable input of the loop inverter NOR gate.

7. A clock generator as set forth in claim 6 characterized in that said delay chain has a delay element of the plurality of the first kind at the end furnishing the output clock signal (TA).

8. A clock generator as set forth in claim 5, characterized in that with increasing chain length later elements in the chain of said plurality of delay elements have a higher delay than the delay of previous elements in the chain.

9. A clock generator as set forth in claim 2 characterized in that said delay chain contains at least six delay elements.

10. A clock generator as set forth in claim 2 characterized in that said delay elements have at least in part a differing delay.

11. A clock generator as set forth in claim 2 characterized in that said inverters contain current mirror circuits to limit a driver current in each case.

12. A clock grerator as set forth in claim 11 characterized in that the delay of an individual delay element is determined at least substantially by the channel length of the transistors of said current mirror circuits determining the driver current.

13. A clock generator as set forth in claim 2 characterized in that said inverters each contain a p-type MOS field-effect transistor and an n-type MOS field-effect transistor connected in series with a switching transistor.

14. A clock generator as set forth in claim 1 wherein said digital phase comparator further comprises an up output and a down output to activate the up-down counter according to the status of two input signals (vi, $V_2$) whereby depending on which of said two input signals ($V_1$, $V_2$) first assumes its active value, the assigned up output and down output respectively is set to an active value and reset following the other input signal becoming active, characterized in that means are provided to lock the non-activated output during resetting of the other output in its non-activated status.

15. A clock generator as set forth in claim 14 wherein said digital phase comparator further characterized in that said up and down outputs have an output RS flip-flop and that said up and down outputs are connected to the set and reset inputs (S. R) of said output, said RS flip-flop furnishing at an output (Q) a single activating signal for said up-down counter.

16. A clock generator as set forth in claim 14 wherein said digital phase comparator is further characterized in that said adjustable oscillator contains a digital closed delay chain which is controlled by a digital up-down counter, the counting direction of which is assignable by said activation signal.

17. A clock generator as set forth in claim 14 wherein said digital phase comparator is further characterized in that said adjustable oscillator is a voltage controlled oscillator.

18. A clock generator comprising:
  a reference oscillator for generating a reference clock signal;
  a digital phase comparator having a reference input for receiving the reference oscillator clock signal, a feedback input for receiving a feedback signal and an adjusting output for generating a comparator signal indicating a counter direction, wherein said adjusting output comprises an up output and a down output depending on which of said two input signals first assumes its active value, the assigned up output and down output respectively is set to an active value and reset following the other input signal becoming active, the phase comparator characterized in that feedback means are provided to lock the non-activated output during resetting of the other output in its non-activated status;
  a digital up-down counter responsive in direction to the comparator signal for generating a delay line length control signal;
  an adjustable oscillator, comprising a digital closed delay chain whose length is determined by a delay line length control signal, for generating an output oscillator signal responsive to the comparator signal; and
  a frequency divider, comprising a digital programmable frequency divider, responsive to the adjustable oscillator for dividing the output oscillator signal to generate the feedback signal for the phase comparator's feedback input.

19. A clock generator as set forth in claim 18 wherein said digital phase comparator further characterized in that said up and down outputs have an output RS flip-flop and that said up and down outputs are connected to the set and reset inputs (S. R) of said output RS flip-flop, the latter furnishing at an output (Q), a single activating signal for said up-down counter.

20. A clock generator comprising:
  a reference oscillator for generating a reference clock signal;
  a digital phase comparator having a reference input for receiving the reference clock signal, a feedback input for receiving a feedback signal and an adjusting output for generating a comparator signal indicating a counter direction;
  a digital up-down counter responsive in direction to the comparator signal for generating a delay line length control signal;
  an adjustable oscillator, comprising a digital closed delay chain whose length is determined by a delay line length control signal, for generating an output oscillator signal responsive to the comparator signal, wherein the delay chain is composed of a plurality of delay elements connected in series, each containing a forward inverter, a return inverter as well as a loop inverter operative to adjust the length of said chain;
  said digital closed delay chain comprising alternating first and second types of resettable delay elements respectively outputting all 0's and all 1's on reset and when added to the delay chain by the delay line length control signal; and
  a frequency divider, comprising a digital programmable frequency divider, responsive to the adjustable oscillator for dividing the output oscillator signal to generate the feedback signal for the phase comparator's feedback input.

21. A clock generator as set forth in claim 20, characterized in that with increasing chain length additional delay elements have a higher delay than the delay elements required for a shorter chain length.

* * * * *

UNITED STATES PATENT AND TRADEMARK OFFICE
CERTIFICATE OF CORRECTION

PATENT NO. : 5,877,641
DATED : March 2, 1999
INVENTOR(S) : Horst Ziegler, et. al.

It is certified that error appears in the above-indentified patent and that said Letters Patent is hereby corrected as shown below:

Title page, item [73], Assignee: should read as following:
Texas Instruments Deutschland GmbH, Germany.

Signed and Sealed this

Twenty-first Day of September, 1999

Attest:

Q. TODD DICKINSON

*Attesting Officer*   *Acting Commissioner of Patents and Trademarks*